United States Patent
Asprey et al.

(10) Patent No.: US 6,184,919 B1
(45) Date of Patent: Feb. 6, 2001

(54) EXTENDED LENGTH DIFFERENTIALLY DRIVEN ANALOG VIDEO LINK

(76) Inventors: Robert R. Asprey, 104 Northwood Cir., Harvest, AL (US) 35749; Philip M. Kirshtein, 593 Sharpes Hollow Rd., New Market, AL (US) 35761; Thomas V. Lusk, 856 County Rd. 220, Scottsboro, AL (US) 35768

( * ) Notice: Under 35 U.S.C. 154(b), the term of this patent shall be extended for 0 days.

(21) Appl. No.: 08/660,076

(22) Filed: Jun. 3, 1996

Related U.S. Application Data

(63) Continuation-in-part of application No. 08/177,442, filed on Jan. 5, 1994.

(51) Int. Cl.[7] .................................................. H04N 7/00
(52) U.S. Cl. .................................................. 348/6; 333/25
(58) Field of Search .................... 348/6; 358/86; 333/1, 12, 25; 178/7.3; 330/124 R

(56) References Cited

U.S. PATENT DOCUMENTS

| | | | |
|---|---|---|---|
| 3,845,240 | * | 10/1974 | Alaily ................................. 178/7.3 |
| 4,054,910 | * | 10/1977 | Chou et al. ......................... 358/86 |
| 5,193,200 | * | 3/1993 | Asprey et al. ...................... 395/800 |
| 5,208,560 | * | 5/1993 | Yasutake ............................. 333/12 |
| 5,257,390 | * | 10/1993 | Asprey et al. ...................... 395/800 |
| 5,283,789 | * | 2/1994 | Gunnarsson et al. ............... 370/124 |
| 5,321,372 | * | 6/1994 | Smith .................................. 333/1 |
| 5,386,518 | * | 1/1995 | Reagle et al. ...................... 395/325 |

* cited by examiner

Primary Examiner—Andrew I. Faile
Assistant Examiner—Uyen Le
(74) Attorney, Agent, or Firm—Mark Clodfelter

(57) ABSTRACT

A source of analog computer video signals is provided, which source may be a video switch providing a single set of computer video signals from one of a plurality of computers. From the source, the video signals are applied to a transmitter that includes circuitry for developing a pair of balanced video signals from each discrete video signal and applying each signal of the pair of balanced signals to respective conductors of a twisted pair of conductors. At the receiver, each balanced pair of video signals is converted back to a single-ended form. Compensation circuitry is provided for compensating for the length of twisted pair conductors between the transmitters and receivers for each video signal. Horizontal and vertical sync signals are applied via respective buffer amplifiers to another twisted pair of conductors in unbalanced relation.

20 Claims, 8 Drawing Sheets

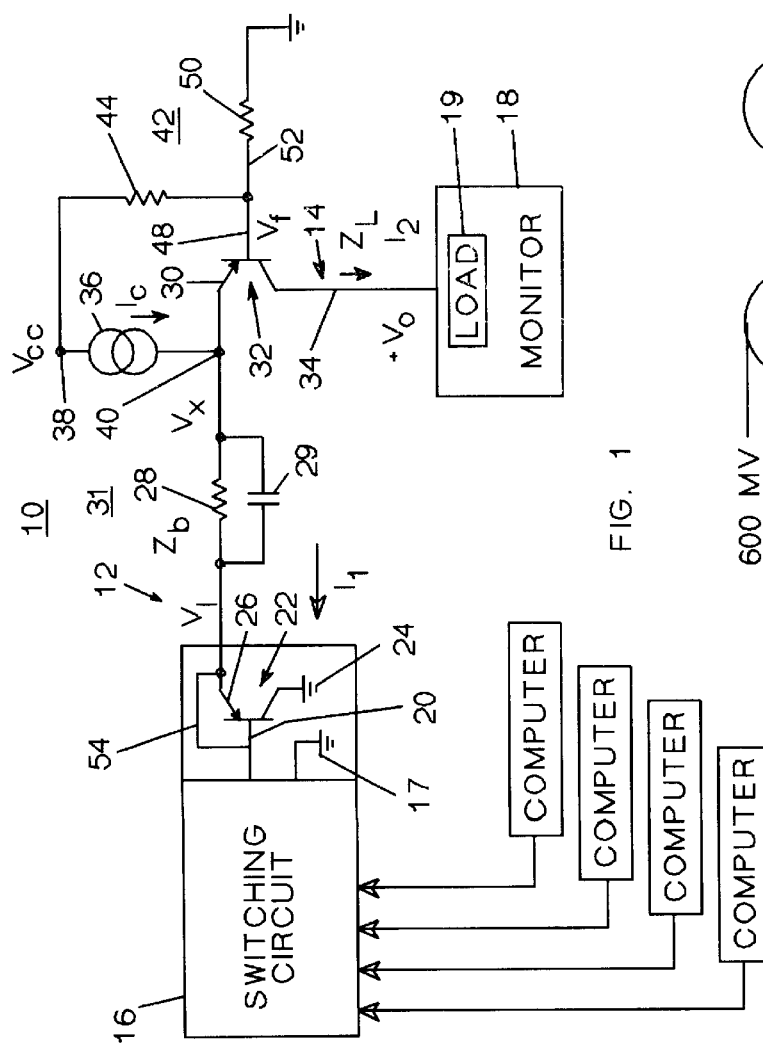
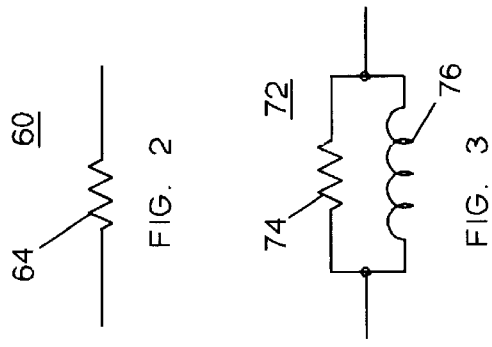
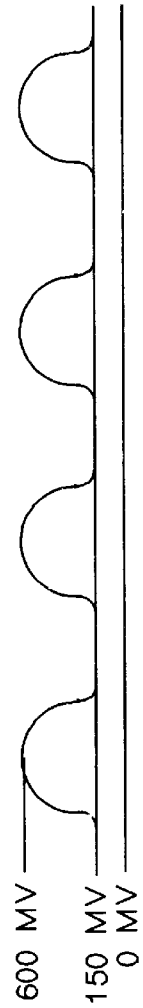
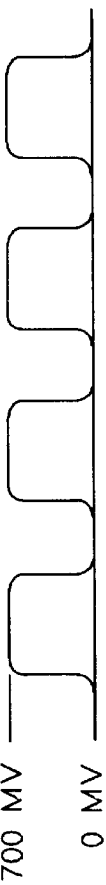
FIG. 1
FIG. 2
FIG. 3
FIG. 4
FIG. 5

000
EXTENDED LENGTH DIFFERENTIALLY DRIVEN ANALOG VIDEO LINK

CROSS REFERENCE OF RELATED APPLICATIONS

This application is a continuation-in-part of application Ser. No 08/177,442, filed Jan. 5, 1994.

FIELD OF THE INVENTION

This invention relates to extended-in-length analog video communications links, and particularly to such a link wherein twisted pair conductors of an unshielded cable are differentially driven at the video source, and converted to a plurality of single ended signals prior to being provided to a monitor. Significantly, there is no direct ground conductor between the transmitter portions and receiver portions of the communications link, with signal returns being provided through low impedance outputs of signal transmitter amplifiers.

BACKGROUND OF THE INVENTION

There are many occasions where it is necessary to process and transmit color computer video signals over communications links. In one such instance, when analog VGA video and keyboard signals are routed between one of a plurality of computers and a single monitor and keyboard by switching equipment, such as the COMMANDER module, manufactured by Cybex Corporation located in Huntsville, Alabama, analog VGA video levels routed thereby may be reduced and high frequency components of the signal attenuated by switching circuitry inside the COMMANDER module. However, signal degradation may occur due to signal interaction in the cable between the COMMANDER module and the monitor.

In another instance, where analog video and other data signals are coupled to or between workstations via relatively long conductors, similar signal losses occur. In order to compensate for these signal losses, it is generally necessary to regenerate voltage amplitude of the video and data signals prior to inputting them to a monitor and other peripheral devices. Typically such regeneration is done by a pair of transistors coupled in a common emitter configuration, with the first transistor inverting the signal and the second transistor reinverting the signal in order to provide noninverted voltage amplification. While this type of amplifier requires power of a single polarity and ground, DC coupling of the amplifiers is generally difficult to implement and not particularly stable. In any case, some type of amplifier circuitry is required at the monitor end of the cable to regenerate the video signals.

There are also instances where it is desirable to distribute a video signal from a single video source to a plurality of monitors remotely located from the source. One example of these situations include airport terminals, where a single video source, such as a computer, provides scheduling information related to incoming/outgoing flights to monitors located at ticket sales desks or other locations where it is desirable to display such information.

While there are a number of extended video communications links presently available, several of which manufactured by CYBEX corporation, and as far as Applicants are aware, none utilize inexpensive, unshielded twisted pair conductors bundled in a cable to transmit analog computer video signals and separate sync signals.

Accordingly, it is an object of this invention to provide an extended analog video communications link having an unpowered passive receiver network and which may be used to distribute such a video signal from a single source to a plurality of monitors.

SUMMARY OF THE INVENTION

A video communications link is disclosed wherein a transmitter is provided with analog video signals, each of the video signals applied as an input to a respective one of a plurality of differential amplifiers. Each differential amplifier provides as outputs a positive video signal and a negative video signal, with these positive and negative signals coupled to conductors of respective twisted pairs of conductors in a cable absent an electromagnetic shield. A plurality of adapters, one for each twisted pair, are coupled to an opposite end of the twisted pair conductors, and function to provide the positive video signal as a single ended output and the negative video signal as a video return signal. As a result, current flow in each of the twisted pairs is equal and opposed, greatly reducing electromagnetic interference radiated from the cable.

BRIEF DESCRIPTION OF THE DRAWINGS

FIG. 1 is a schematic view of a video regeneration circuit.

FIG. 2 is a schematic view of an alternate embodiment of a portion of the circuit shown in FIG. 1 which configures the circuit of FIG. 1 as a constant current amplifier having broadband amplification characteristics.

FIG. 3 is a schematic view of an alternate embodiment of a portion of the circuit shown in FIG. 1.

FIG. 4 is an example of an analog video waveform applied to an input region of FIG. 1.

FIG. 5 is an amplified waveform of the waveform of FIG. 4 and which is applied to a monitor.

FIG. 11a is a schematic drawing indicating decoupling of a signal ground from a chassis ground of the invention.

DETAILED DESCRIPTION OF THE DRAWINGS

Figure 6:
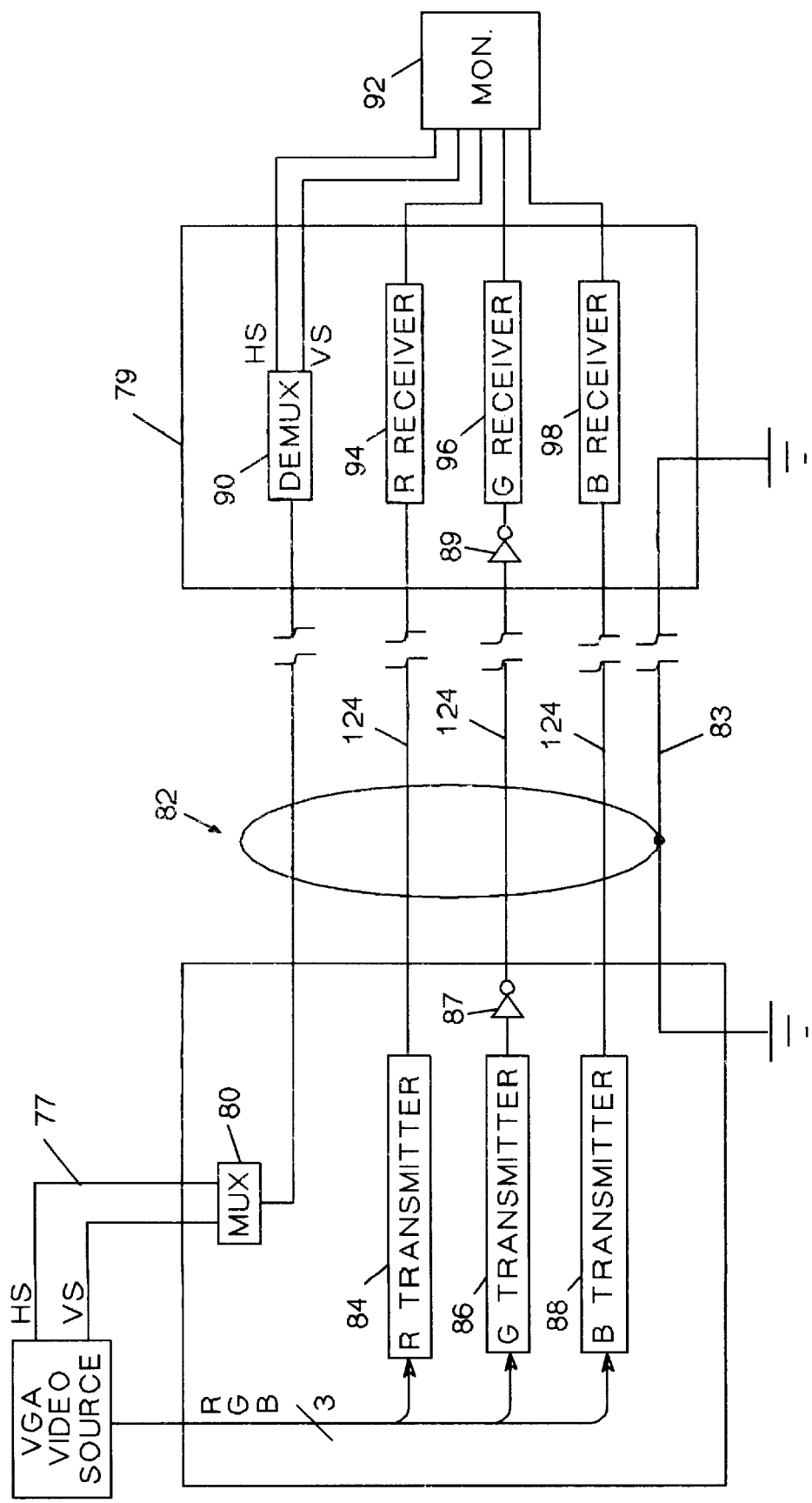
FIG. 6 is a block diagram of one embodiment of the present invention.

Referring initially to FIG. 1, a non-inverting, constant current amplifier 10 is shown having an input region 12 and an output region 14. Input region 12 is coupled to a video switching circuit 16 such as the aforementioned Commander module, which in turn is coupled to a plurality of computers. Where a monitor for displaying video from a selected computer is located some distance from the computers there is degradation of the video signal that includes lowered amplitude and attenuation of high frequency components of the signal. In this embodiment, and by way of example, wherein the Commander module is used, the output analog video signal is provided by an emitter 26 of a PNP transistor 22 in the Commander module. Output region 14 of amplifier 10 is coupled to a load having known characteristics, such as an analog video monitor 18 or other analog device, with amplifier 10 providing a non-inverted, amplified representation of the input signal across the load. Where the output is coupled to a conventional analog VGA computer monitor 18, the monitor represents a load 19, which may be a resistor of about 75 ohms, with the output signal from region 14 across this 75 ohm load being about 700 millivolts. In this instance, it is to be appreciated that there would be a discrete circuitry 10 for each of the discrete video signals which, in the instance of a VGA monitor, include primary red, green, and blue analog signals. While this circuitry in the preferred embodiment may be implemented with respect to the currently manufactured Commander module, it will be apparent to those skilled in the art that numerous other applications exist where non-inverting analog amplification is required or desired.

Network 31, a bypass impedance for diverting current flow, as will be described, couples the input from emitter 26 of transistor 22 to the emitter of transistor 32. Generally, in the Commander module, PNP transistor 22 is coupled in emitter-follower configuration and connected to network 31, with a base 20 of transistor 22 coupled to the weakened analog video input signal. As such, collector 24 of transistor 22 is coupled to ground, providing an alternate current path to ground for the video signal, and emitter 26 is coupled to bypass impedance 31, illustrated in FIG. 1 as an RC network. Resistor 28 of network 31 has a value of about 20 ohms, and capacitor 29 has a value of about 220 pF, network 31 serving to divert current in a direct relationship from the load impedance responsive to positive voltage excursions of the input signal applied to base 20. Impedance 31 may be fixed to provide a fixed gain amplifier, or may be variable to provide a variable gain amplifier, and is coupled on an end opposite emitter 26 to emitter 30 of PNP transistor 32. Collector 34 of transistor 32 is coupled directly to analog monitor or other peripheral device 18, which transistor, in the preferred embodiment, is a 2N2907a or equivalent, which is characterized by having a typical current gain of about 200, and is further able to maintain constant emitter voltage for a given base voltage. A constant current source 36, which may be a resistor coupled to a stable voltage source, such as 4.5 volts, is coupled to terminal 40 between network 31 and emitter 30, and provides a current limited source of about 9.33 milliamps to be divided between network 31 and transistor 32. A voltage divider circuit 42 includes a resistor 44 coupled at one end to the 4.5 volt voltage source at terminal 38 and at an opposite end to terminal 52, also coupled to base 48 of transistor 32. A second resistor 50 is coupled at one end to a ground potential, and at an opposite end to junction 52, with values of resistors 44 and 50 selected to provide a potential to base 48 of transistor 32 no lower than a highest anticipated peak input potential of the analog signal at the base of transistor 22, including any DC offset that may be present.

In the Commander module, it has been found that the analog video signal may be degraded to about 450 millivolts with a positive 150 millivolt DC offset. Thus, values of resistors 44 and 50 are selected to provide about 650 millivolts to terminal 52. With the described voltages applied to transistor 32, a lowest input signal at the input diverts current flow from transistor 32 to flow through resistor 28, reducing current flow through transistor 32 and the voltage at terminal 38 to a point where transistor 32 is biased in its operating range just above its cutoff point. As the input signal increases, current flow through resistor 28 decreases, slightly increasing a voltage level at terminal 40, biasing transistor 32 to a more conductive state and resulting in more current flow through transistor 32 and in turn increasing potential across load 19 in direct relation with the input signal.

In the instance where the signal from source 16 is of lowered amplitude and is attenuated, but possesses sufficient current sourcing capabilities to drive network 31, the analog input signal is the input signal coupled directly to network 31, as represented by dashed line 54. In this configuration, resistors 44 and 50 are selected to provide a voltage at terminal 52 of about 650 millivolts below a highest anticipated peak input potential of the analog signal in order to compensate for elimination of the diode drop of transistor 22. Additionally, an output driver of switching circuit 16 would also be conventionally configured to provide an alternate current path to ground, as illustrated by ground 17. In this instance, when the input signal is at a lower state, current flows from current source 36 through network 31 to ground 17.

While the specific example described above which includes transistor 22 is an application tailored for the Commander module wherein the load is resistive in nature, a more generalized representation of the instant invention without transistor 22 may be illustrated where both load and bypass impedances are complex impedances. Theoretically, and assuming a transistor having a high current gain for transistor 32, the impedance of network 31 may be represented as $Z_b$, with the analog signal source voltage represented by $V_i$, which in this instance, is coupled directly to network 31 (dashed line 54), and the highest excursion of the analog signal defined by $V_x$. Current through impedance 31 ($Z_b$) is represented as $I_1$. The voltage applied to base 48 is represented as $V_f$, and as stated, is selected to be no lower than the highest peak amplitude of the input signal $V_x$ minus the approximately 650 millivolt diode drop of the emitter-base junction of transistor 32. With such voltages applied to transistor 32, the voltage at junction 40 only fluctuates slightly due to the fixed base voltage and the forward biased emitter-base junction of transistor 32, with this slight fluctuation being sufficient to directly vary conductivity of transistor 32 and resultant current flow therethrough with respect to the input signal. This generally constant voltage at junction 40 is represented by $V_x$ (max peak amplitude), with $I_c$ being current from constant current supply 36. The load is represented by $Z_l$, a complex impedance, with current flow through the load represented as $I_2$ and voltage across load $Z_l$ represented as $V_o$. With such designations, voltage across the load is defined by:

$$V_o = I_2 \times Z_l$$

and the constant current into junction 40 being a sum of the output currents, or $$I_c = I_1 + I_2$$

The deflected current through impedance $Z_b$ is defined by:

$$I_1 = V_x - V_1/Z_b$$

with the inversely proportional flow of current through load $Z_l$ defined by:

$$I_2 x - I_c - I_1 = I_c - V_x - V_1 / Z_b$$

and the voltage across the load defined by:

$$V_o = Z_l I_2 = (I_c - V_x - V_1/Z_b) \times Z_l$$

For a change of input voltage $V_i$, $$VP_o = (I_c - V_x - V_1/Z_b) \times Z_l = (O - (O - V_1)/Z_b) \times Z_l$$

which when resolved, becomes:

$$VO = V_1/Z_b \times Z_l$$

yielding an AC gain of:

$$V_o/V_1 = Z_l Z/Z_b$$

Thus, it is seen that gain of the amplifier is strictly controlled by load impedance and bypass impedance. In the specific example given for the Commander module, impedance of load $Z_b$ is about 75 ohms resistive, the magnitude of impedance of network 31 at a DC potential is about 20 ohms, and at 30 Mhz is about 0.6 ohms, as given by the generalized circuit analysis in the foregoing and familiar to anyone skilled in the art. Therefore, it is demonstrated that the above described amplifier of the preferred embodiment possesses frequency sensitive gain which various from a gain of about 75/20=3.75 ($Z_l$ divided by $Z_b$) at a DC level and a gain of about 75/0.6=125 at 30 Mhz. For the various embodiments illustrated and described hereinafter, the bypass impedance is first determined, and gain calculated by dividing load impedance by the bypass impedance.

For configuring amplifier 10 to selectively amplify particular frequencies, reference is made to FIGS. 2 and 3. Here, as shown in FIG. 2, a resistance 64 is substituted for network 31 in FIG. 1. This configures amplifier 10 as a broadband amplifier which has gain independent of frequency as long as the load is frequency independent. FIG. 3 illustrates an LR network 72 including resistor 74 coupled across inductor 76, which when substituted for network 31, provides an amplifier 10 having a gain inversely proportional to frequency. Alternately, resistor 74 may be coupled in series with inductor 76 (not shown). It is significant to note that in any of the described embodiments, gain of the amplifier is the load impedance divided by the deflection impedance.

In operation, and referring to FIG. 1, as analog video signal voltage referenced to ground from the Commander module is taken from one of a plurality of computers and, is applied to base 20 of transistor 22. In this instance, bias voltages of transistors 22 and 32 are obtained from terminal 40, with a reference voltage of about 600 millivolts taken from terminal 38 and applied to base 48 of transistor 32. The voltage at terminal 40 is about 1.2 volts, which is a diode drop of about 650 millivolts above the reference voltage applied to base 48 and which is varied as described by transistor 22 responsive to excursions of the input signal applied to base 20. The input signal, as shown in the waveform of FIG. 4, is offset to a positive DC bias of about 150 millivolts due to switching levels in the Commander module, and degraded in amplitude as by a long length of conductor at input region 12 to have a swing of about 450 millivolts between about 150 millivolts and 600 millivolts. This signal, when at the 150 millivolt level and applied to base 20 of transistor 22, biases transistor 22 ON, deflecting virtually all the 9.33 milliamps from current source 36 through 20 ohm resistor 28 due to the difference of voltage potentials on either side of resistor 28, with this current being applied to ground via transistor 22. This depletes current flow through transistor 32 and reduces voltage at terminal 40 to just above a cutoff voltage, reducing the IR voltage drop across the monitor load to 0 volts, as seen in the waveform of FIG. 5. As the input signal applied to base 20 rises to about 600 millivolts, transistor 22 is biased toward its cutoff region, and with about 1.2 volts applied to emitter 26 from terminal 40, less current flows through network 31 due to decreasing potential difference across resistor 28. This in turn slightly increases potential at terminal 40 such that transistor 32 is biased more toward a conductive state, resulting in increasing current flow through transistor 32 to the 75 ohm load in monitor 32. As the potential across network 31 equilibrates as transistor 22 is driven toward cutoff, the entire 9.33 milliamps from constant current source 36 is shifted to flow through transistor 32 and the 75 ohm monitor load, increasing the potential across the 75 ohm load to about 700 millivolts, as shown in FIG. 5, a conventional level for an analog monitor. As described, as the input signal fluctuates between low and high levels, the constant current is divided and fluctuates with the input signal between transistors 22 and 32. In the absence of transistor 22, an analog video signal extending from about 150 millivolts or lower to about 600 millivolts is applied to network 31, and when at the lowest level, draws a highest level of current flow through network 31, which current flow applied to ground 17, reducing potential on emitter 30 to a level to bias transistor 32 to a higher impedance, reducing output on collector 34 to 0 volts. As the signal applied to network 31 increases, less current flows through resistor 28, increasing a potential at terminal 40 and biasing transistor 32 to a more conductive state in direct relationship with the input signal, shifting current flow to the load via transistor 32 and increasing voltage drop thereacross. In the event the input signal exceeds the reference potential applied to terminal 52, as by a noise spike, biasing transistor 32 into saturation, the load is generally protected from an overvoltage condition due to the constant current source 36 providing only 9.33 milliamps current flow to the load.

Figure 7:
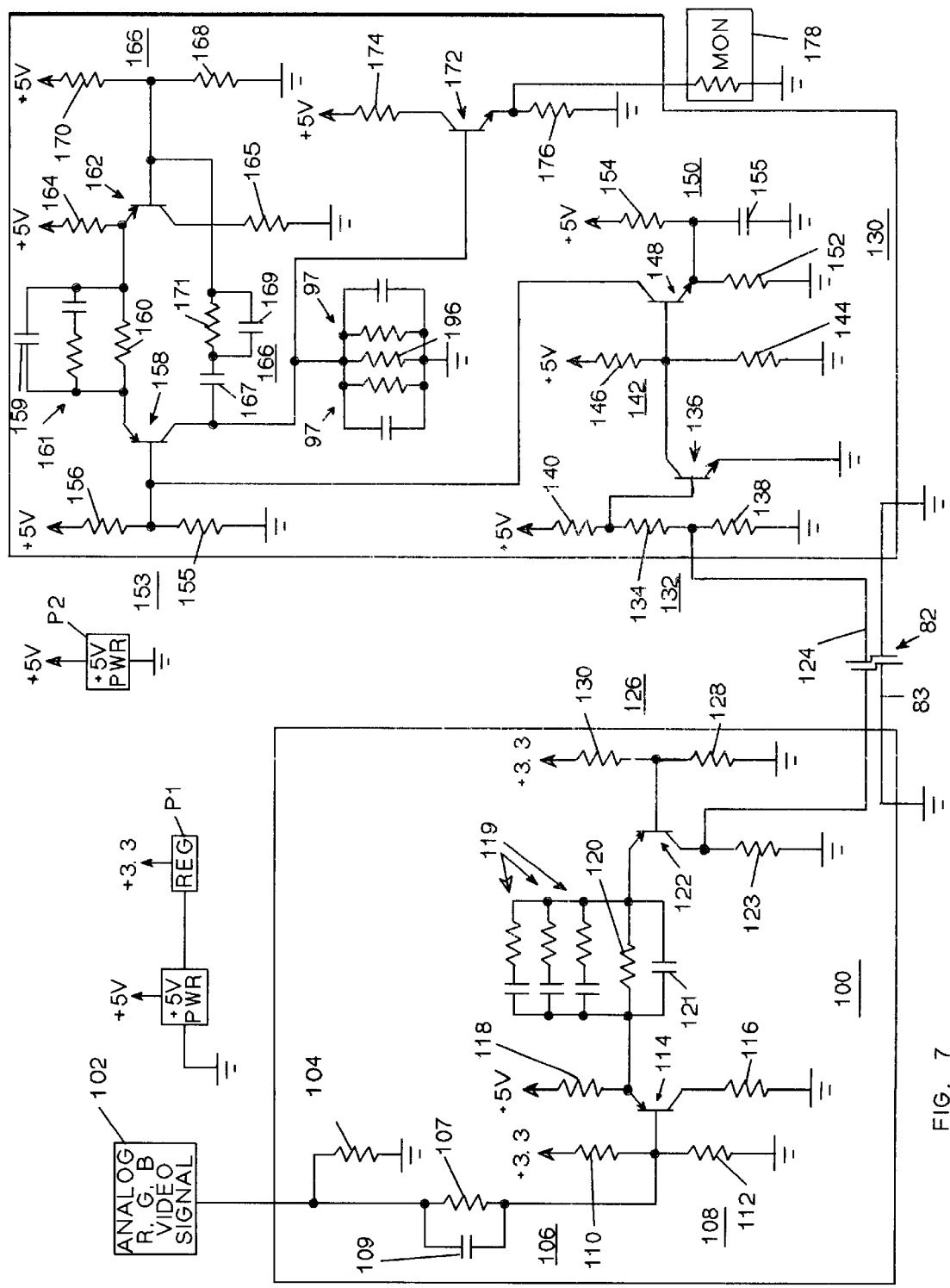
FIG. 7 is a schematic illustration of one embodiment of the present invention.

One particular usage of the video amplifiers as described above is illustrated in FIG. 6. Here, a VGA video source, such as, but not limited to, a computer or plurality of computers coupled to a switching circuit 16 (FIG. 1), provides analog VGA red (R), green (G) and blue (B) video signals to a video transmitter 77 coupled to a receiver 79 via a cable 82 having a grounded shield 83. The sync signals vertical sync (VS) and horizontal sync (HS) are initially provided to a multiplexer 80 as described in U.S. patent application Ser. No. 07/736,508, now Pat. No. 5,257,390 and which is incorporated herein by reference. Multiplexer 80 multiplexes the VS and HS signals and applies the multiplexed signal to a single conductor of extended-in-length cable 82, with the multiplexed signals being demultiplexed at demultiplexer 90 in receiver 79. Power may be provided by the keyboard port of a computer, or alternately by a power supply, which provides +5 volts DC as necessary to the transmitter portion (FIG. 1) and of the system of FIG. 6. This +5 volt DC potential, where it is provided by a computer, may fluctuate somewhat, and thus may be regulated at a potential of 3.3 volts by a voltage regulator P1, as shown in FIG. 7. This prevents any noise or fluctuations from being induced into the video signals. A separate, regulated power supply P2 (FIG. 7) provides +5 volts to the receiver portion of the system, with a common ground being provided between the transmitter and receiver via a conductor 82.

Referring back to FIG. 6, the video signals R (red), G (green), and B (blue) are each provided to a discrete transmitter circuit 84, 86, and 88, respectively, each of which conditions the respective video signal and applies a conditioned video signal in single ended relation to a conductor of cable 82. The conditioning of the video signals includes reducing the analog video signals from their normal amplitude swing of from 0–700 millivolts to a swing of from about 0–200 millivolts, and further includes shaping of the video signals to counteract distortion and attenuation affected by cable 82. These functions are performed by amplifier 10 of FIG. 1 and a modified version 100 thereof shown in FIG. 7.

In receiver 79 (FIG. 6), the HS and VS signals are applied to monitor 92 after being demultiplexed in demultiplexer 90. Concurrently, the R, G, and B signals are each restored to their original amplitude swing of from 0–700 millivolts in each of the R, G, and B receiver circuits 94, 96, and 98, respectively, and applied to monitor 92.

A single ended transmitter and receiver system for the R, G, and B signals, as shown in FIG. 7, uses substantially the same constant current amplifier as described in the foregoing. In an analog VGA environment, one of these systems is necessary for each of the R, G, and B video signals as shown in FIG. 6. Further, in some systems, one of the video signals may be inverted to reduce signal interaction and interference, as broadly illustrated by transmitter inverter 87 and receiver inverter 89 (FIG. 6).

Initially, as shown in FIG. 7, at transmitter 100 a one of the analog VGA video signals R, G, or B, which respectively carry the red, green, and blue video information and which each have a signal swing of from about 0–700 millivolts, is provided from source 102 and applied across a resistor 104 which may be about 76 ohms and coupled between the signal line and a ground reference potential. Resistor 104 serves to attenuate the video signal and draw a small current flow from the signal line to reduce induced noise. The attenuated signal is then passed across an RC network 106 constructed of a resistor 107 which may be about 509 ohms, and a capacitor 109 which may be about 68 picofarads, which network 106 serving to attenuate the video signal to have a signal swing of about 400 millivolts, after which the signal is passed across voltage divider network 108. Network 108 comprises a resistor 110 which may be about 604 ohms, and a resistor 112 which may be about 1.62K ohms, with resistor 110 coupled to a source of regulated 3.3 volt bias power and resistor 112 coupled to the ground reference potential. This combination of resistors 104, 107, 110, and 112 and networks 106 and 108 form a termination network yielding an equivalent impedance of about 75 ohms at low frequencies. This network serves to terminate the incoming signal while providing a much higher impedance, in the thousands of Ohms range, to the AC portion of the signal. Additionally, network 106 provides a voltage offset of about 1.9 volts, so the reduced video signal of 400 millivolts peak-to-peak is superimposed on the 1.9 volt offset with a signal swing of from about 1.7–2.1 volts peak-to-peak. This signal is applied to the base of a PNP transistor 114, which has a collector coupled to the ground reference potential via resistor 116 which may be about 29.4 ohms. The emitter of transistor 114 is coupled to the +5 volt source via resistor 118 which may be about 140 ohms, which resistor providing a source of constant current. Additionally coupled to the emitter of transistor 114 via shunt resistor 120 is the emitter of a second PNP transistor 122 of an identical type as transistor 114, and which also has a collector coupled to the ground reference potential via a resistor 123 which may be about 59 ohms. Typically, a capacitor 121 which may be about 220 picofarads is coupled across networks 119 to pass high frequency components of the video signal.

The base of transistor 122 is coupled to a midpoint of a voltage divider network 126, which is constructed of resistor 128 which may be about 5.9K ohms, and coupled to the reference ground potential, and resistor 130, which may be of about 590 ohms, and coupled to the 3.3 volt bias power source. Network 126 provides a fixed reference potential of about 1.65 volts to the base of transistor 122, this potential being about 0.35 volts less than the potential provided by voltage divider network 108 to the base of transistor 114. By providing a slightly smaller reference potential to the base of transistor 122, a slight imbalance in the biasing of transistors 114 and 122 is created which generates a current flow through resistor 120 and transistor 122 with no applied signal to transistor 114. In the transmitter, transistor signal losses are compensated by RC circuit 106.

The output of transmitter 100 is taken from the collector of transistor 122 and applied to one of conductors 124 of an extended cable 82. Conductors 124 are terminated on the transmitter side by 59 ohm termination resistor 123, which terminates conductor 124 at its characteristic impedance, and which also provides a voltage drop so that the video signal has about a 200 millivolt swing centered about an offset potential of about 0.5 volts. Cable 82, in this example, is of a type such as Belden 9936, a 15 conductor, low capacitance shielded cable which has been found to pass the video signal at distances up to 1500 feet in length, although with additional tuning, it is believed that the conductor of this type will pass the video signal greater distances.

The video signals R, G, and B from conductors 124 are each connected to a respective one of like receivers 130, with the video signals being first applied across a voltage divider network 132. Network 132 is constructed of a resistor 134 which may be about 64.9 ohms and coupled to the base of a transistor 136, and a resistor 138 which may be about 64.9 ohms and coupled to ground reference potential. A third resistor 140 which may be about 523 ohms is coupled to the base of transistor 136 and to the +5 volt bias potential from power supply P2. Resistors 134, 138, and 140, in combination, provide line termination at the receiver side of conductor 124 at about 59 ohms, the characteristic impedance of conductor 124, and additionally provide a voltage offset of about 1.0 volt to the video signal at the midpoint between resistors 134 and 140. At the midpoint of resistors 134 and 138, the offset is 500 millivolts, insuring that there is no steady state current flow present in conductors 124. As such, and as the amplitude and high frequency components of video signal are attenuated by the extended length of conductor 124, which as stated may be any length up to about 1500 feet, the video signal applied to divider network 132 may swing about 200 millivolts peak-to-peak for a shorter conductor of about 50 feet and about 190 millivolts peak-to-peak for a longer conductor of about 600 feet. The attenuated signal is superimposed on the 1.0 volt offset provided by resistor 140 and the combined resistances of resistors 134 and 138, and is applied to the base of transistor 136.

The collector of transistor 136 is coupled to the ground reference potential, and the emitter is coupled to voltage divider network 142. Network 142 is constructed of a resistor 144 which may be about 590 ohms and coupled to the ground reference potential, and a resistor 146 which may be about 806 ohms and coupled to the +5 volt power source, this network providing an increased offset potential of about 2.1 volts to the attenuated video signal. Coupled as described, transistor 136 is connected in emitter-follower configuration, so that there is approximately unity gain in this stage, with the offset potential of 1 volt being increased to swing from about 1.9 volts to about 2.1 volts. This signal is applied to the base of an inverting and amplifying stage including NPN transistor 148, which has an emitter coupled to a voltage divider network 150 constructed of a resistor 152 which may be about 205 ohms and coupled to the ground reference potential, and a resistor 154 which may be about 3.57K ohms, and coupled to +5 volts bias power. Network 150 maintains a constant voltage of about 270 millivolts on the emitter of transistor 148. A capacitor 155 which may be about 180 picofarads is coupled across resistor 152, and restores high frequency portions of the signal lost by transistor 148.

The collector of transistor 148 is coupled to the midpoint of a voltage divider network 153 constructed of resistor 155 which may be about 4.99K ohms and coupled to the ground reference potential, and resistor 156 which may be about 511 ohms and coupled to the 5 volt bias potential. The values of resistances of divider network 153 are selected to increase the midpoint of the video signal to about 2.8 volts, biasing transistor 148 into its operating region and providing gain of about 1.9, which boosts signal swing of the video signal to about 375 millivolts. Additionally, the NPN junction of transistor 148 provides temperature compensation for the preceding PNP junction of transistor 136.

The collector of transistor 148 is also coupled to the base of a PNP transistor 158, which has an emitter coupled via a shunt resistor 160 which may be about 82.5 ohms and a parallel capacitor 159 which may be about 56 picofarads to the emitter of a PNP transistor 162. Additionally, the emitters of these transistors are coupled to the +5 volt source of bias potential via a resistor 164 which may be about 82.5 ohms. Resistor 164, like resistor 118 in transmitter 100, provides a constant current from the +5 volt bias potential to be divided between transistors 158 and 162. The collector of transistor 162 is coupled to ground reference potential via a resistor 165 which may be about 195 ohms, and the base of transistor 162 is coupled to the midpoint of a voltage divider network 166, which is constructed of resistor 168 which may be about 1K ohms and coupled to the ground reference potential, and resistor 170 which may be about 464 ohms and coupled to the 5 volt bias potential. This network 166 provides a voltage reference to the base of transistor 162 of about 3.4 volts, which is higher by about 0.6 volts than the offset of about 2.8 volts provided by network 153 to transistor 158. As with transistors 114 and 122 in transmitter 100, this provides an imbalance in the biasing of transistors 158 and 162, causing current to flow through resistor 160 and transistor 158 with no applied signal to transistor 158.

Figure 7A:
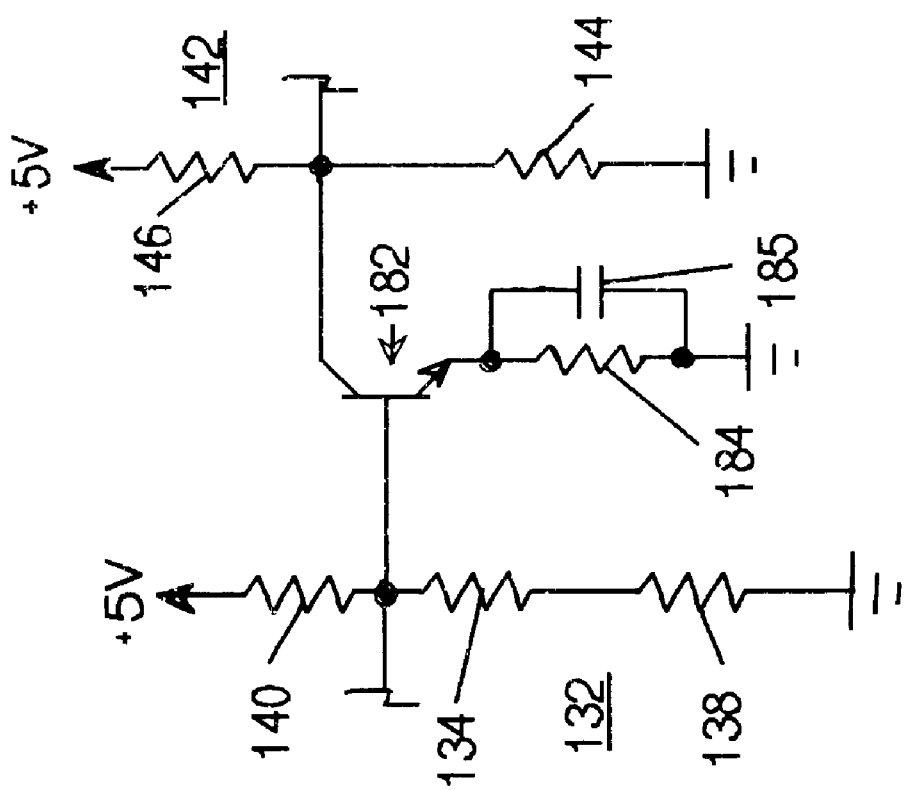
FIG. 7a is a schematic illustration of inverter circuitry of the present invention.

The video signal, which is taken from the collector of transistor 158, is inverted, and amplified by transistor 158 with a gain of about 1.9 to have a signal swing of about 700 millivolts:, is applied across a resistor 196 which may be about 196 ohms, and applied to the base of an NPN buffer transistor 172. With two amplifying stages including transistors 148 and 158, amplification of the video signal is divided between these stages so as not to overdrive either of transistors 148 and 158. Transistor 172 has a collector coupled via a short circuit protection resistor 174 which may be about 33 ohms to bias power, and an emitter coupled via a resistor 176 which may be about 1K ohms to the reference ground potential. The output video signal is taken from the emitter of transistor 172 and applied to a load resistor of about 75 ohms in monitor 178. Transistor losses in the receiver are compensated by the RC network formed by resistor 152 and capacitor 155, and the reactive network 166 which includes capacitors 167, 169, and resistor 171. In FIG. 7a, the RC network made up by resistor 184 and capacitor 185 compensates for losses of transistor 182. Additionally, receivers 130 may be selectively "detuned" by inserting RC networks 97 across resistor 196. This would be useful where the transmitter is tuned for a longer conductor, with the number of RC circuits 97 coupled across resistor 196 being selectable by switches (not shown) to "detune" the receiver for a selected shorter cable length.

In operation of the preferred embodiment, the R, G, or B analog VGA video signal is applied from source 102 across resistor 104 and network 106, which attenuates swing of the video signal to about 400 millivolts peak-to-peak. The attenuated video signal is then provided to the base of transistor 114 together with a voltage offset of about 2.6 volts from divider network 108. As such, when the video signal is at a higher potential in its swing, transistor 114 is biased to a less conductive state, causing a voltage rise to develop on the emitter of transistor 114. In turn, this causes more current to flow through resistor 120 and develop a voltage increase at the emitter of transistor 122. This biases transistor 122 to a more conductive state, increasing current flow therethrough and developing an increased voltage drop across resistor 123, with the increase in voltage being applied to conductor 124.

With a decrease in the video signal applied to the base of transistor 114, transistor 114 is biased to a more conductive state, causing more current to flow therethrough, lowering the voltage at the emitter of transistor 114. This reduces the voltage drop across resistor 120 and causes a smaller potential to develop at the emitter of transistor 122, biasing it to a less conductive state. This in turn causes the voltage at the emitter of transistor 122 to fall, reducing the signal level applied to conductor 124; thus, there is no reversal of the phase by transmitter 100 of the input signal, for example, the G signal.

At receivers 130, the attenuated video signal from respective ones of conductors 124 is applied to corresponding networks 132, each of which provides a 1.0 volt offset to the signal, which is passed via resistor 134 to the base of transistor 136. Here, a rise of the potential of the video signal biases transistor 136 to a less conductive state, allowing a corresponding increase of potential to develop at the emitter. This increase, which is superimposed on the 2.0 volt offset provided by network 142, is applied to the base of transistor 148, biasing it to a more conductive state and allowing proportionally more current to flow therethrough due to selection of the bias voltages applied to the base and emitter of transistor 148. This in turn proportionally reduces the potential at the collector of transistor 148, effecting inversion and amplification of the video signal. The lowered potential at the collector of transistor 148 is applied to the base of transistor 158, biasing transistor 158 to a more conductive state, increasing current flow therethrough, which effects amplification and inversion of the video signal. At transistor 162, the increased current flow through transistor 158 causes a corresponding reduced current flow through transistor 162 by lowering the potential applied to the emitter of transistor 162, keeping current provided by resistor 164 constant. The increased current flow through transistor 158 develops a higher potential applied to the base of buffer transistor 172, biasing it to a more conductive state and allowing more current to flow therethrough. This increased current flow develops a higher voltage drop across resistor 176, which is applied to the appropriate video signal input of monitor 178. With a decrease of signal voltage applied to network 132 from conductor 124, this decrease is felt at the base of transistor 136, biasing it to a more conductive state, which allows a lower potential to develop at the base of transistor 148. This biases transistor 148 to a less conductive state, allowing less current to flow therethrough, increasing the potential at the base of transistor 158. This biases transistor 158 to a less conductive state, decreasing current flow therethrough and causing an increased potential to be felt at the emitter of transistor 162, biasing it to a correspondingly more conductive state. The decreased current flow through transistor 158 causes a lower potential to develop at the base of transistor 172, biasing it to a less conductive state and allowing a lower potential to develop across resistor 176, which is applied to the signal input of monitor 178.

Figure 8:
FIG. 8 is a partial, cross sectional view of how video signals are applied to selected conductors of a cable of the present invention.
Figure 7B:
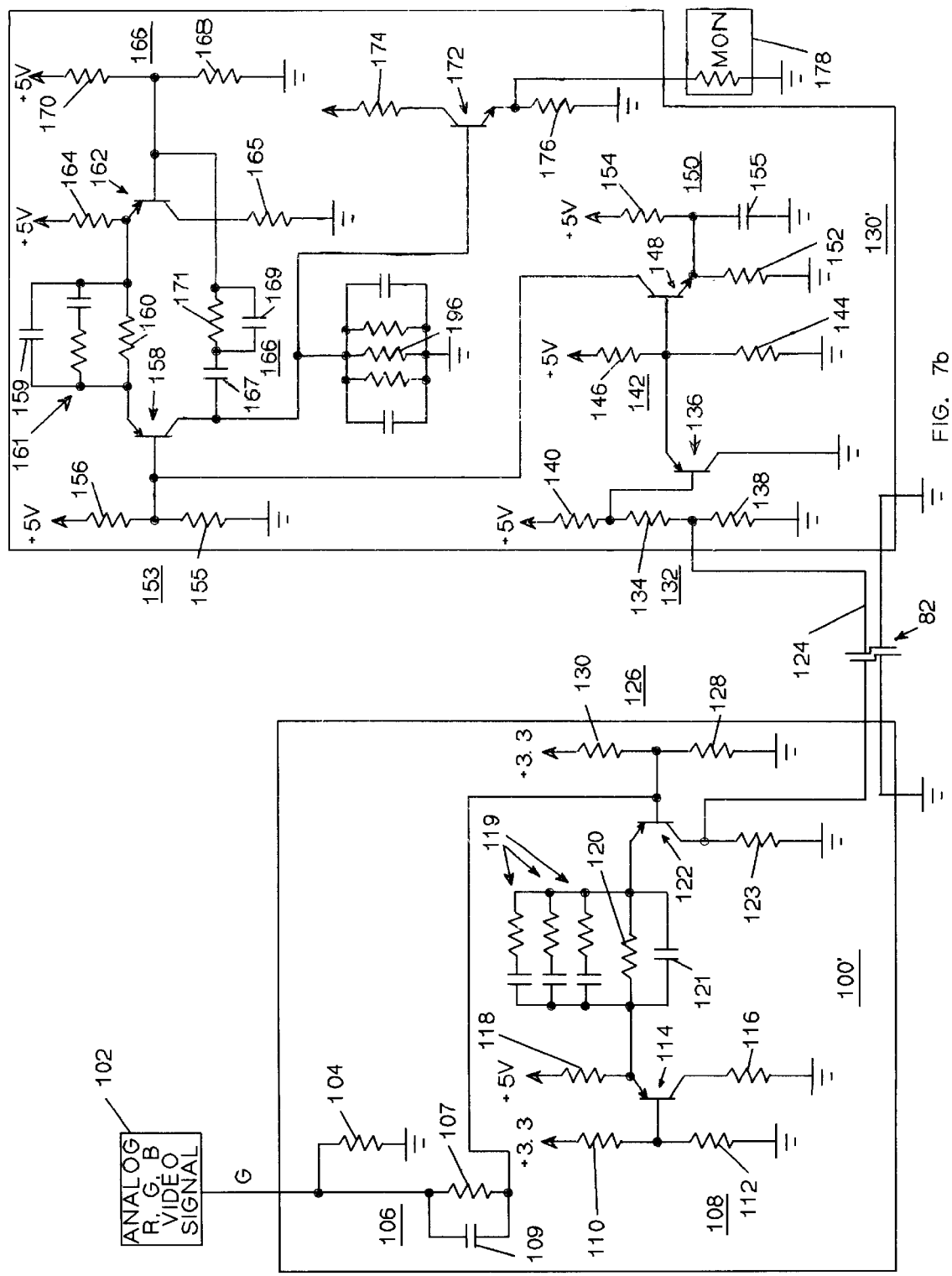
FIG. 7b is a schematic illustration of an embodiment of the invention.

In the instance where it is desired to apply one or more of the R, G, and B signals to a conductor 124 in an inverted state, as would be the case where it is desired that the voltage fluctuations of the video signals applied to the discrete conductors be of opposed polarities, thus reducing the possibility of radiated interference in cable 82, reference is made to FIGS. 7a, 7b and 8. FIG. 8 illustrates the cable lie of an embodiment wherein the conductors carrying the R, G, and B video signals are positioned next to each other, as shown by conductors designated R, G, and B. Here, the signal carried by the middle conductor, in this case the G signal, is inverted to reduce interference with the adjacent conductors. This has been found to be particularly important with software having a predominantly white background, which requires all of the R, G, and B signals to be at high levels.

Accordingly, in this example, and with respect to FIG. 7b, the G signal from source 102, instead of being applied to the base of transistor 114, is applied across resistor 104 and network 106 and then applied to the base of transistor 122. Thus, transistor 122 effects a signal inversion on collector resistor 123. The coupling of all other components in transmitter 100' remains as described in the foregoing, with the exception that transistor 122 and transistor 114 are selected to be of a higher speed. This eliminates any phase shift that may occur due to inversion of the G video signal in transmitter 100'.

As the G video signal is inverted when it arrives at receiver 130', it is necessary to effect an extra inversion of the G video signal. This is done as shown in FIG. 7a, where PNP emitter-follower transistor 136 (FIG. 7) is replaced by an NPN transistor 182 (FIG. 7a). Here, the base of transistor 182 is coupled to divider network 132 as discussed in the foregoing, with the collector of transistor 182 coupled to network 142, also as discussed in the foregoing. The emitter of transistor 182 is coupled to the ground reference potential via an RC network consisting of resistor 184, which may be about 301 ohms, and capacitor 185. Coupled as described, transistor 182 forms an inverting stage that reinverts the inverted video signal from conductor 124 back to its original polarity.

In operation, the video signal to be inverted, which is stated to be the green video signal applied to the G transmitter 86 in the preferred embodiment, is attenuated to have a swing of about 400 millivolts peak-to-peak and applied to the base of transistor 122. Here, as the video signal swings to a higher level, transistor 122 is biased to a less conductive state, lowering the signal potential applied to conductor 124, inverting the video signal applied to conductor 124. This in turn increases the voltage at the emitter of transistor 114, biasing transistor 114 to a more conductive state and shifting the constant current flow through resistor 118 such that more flows through transistor 114.

The inverted, reduced swing video signal attenuated by conductor 124 is received as described in the G receiver 96 across network 132, which terminates conductor 124 and applies an offset to the inverted video signal. The signal is then applied to the base of transistor 182, (FIG. 7a) which drives transistor 182 to a state of less conductivity, allowing a higher signal level to develop at the collector of transistor 182. This reinverts the G video signal, and passes the reinverted signal to the base of transistor 148 (FIG. 7b), which acts on the video signal as described above.

When the G video signal applied to the base of transistor 122 (FIG. 7b) decreases to a lower level, transistor 122 is biased to a more conductive state, providing more current flow through resistor 123 and developing a higher voltage drop thereacross. The potential of this drop is applied to conductor 124, effecting an inversion of the G video signal.

At receiver 130', the inverted, higher G video signal is applied to network 132 as described, and then to the base of transistor 182 (FIG. 7a), biasing transistor 182 to a more conductive state. This pulls the voltage from divider network 142 applied to the collector of transistor 182 to a lower potential, reinverting the video signal and passing the reinverted video signal to the base of transistor 148 (FIG. 7b), which functions as described above.

Figure 9:
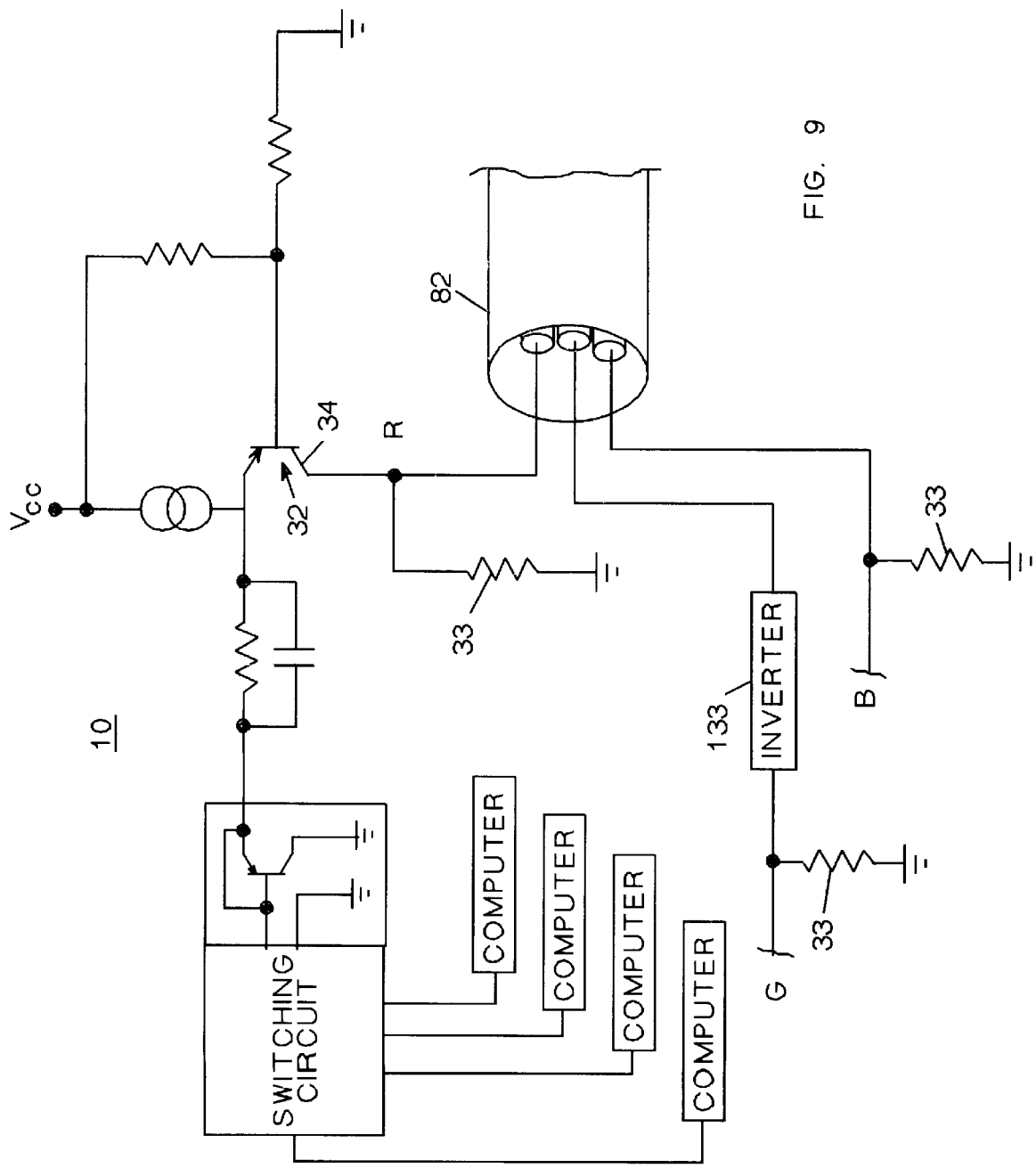
FIG. 9 illustrates an embodiment of the present invention wherein three of the circuits shown in FIG. 1, together, supply three video signals to a multi-conductor cable.

As shown in the embodiment of FIG. 9, it is believed the circuitry shown in FIG. 1, being repeated, may be used to apply individually the R, G, and B video signals to discrete conductors R, G, and B of a cable 82. Here, with only R circuitry for the R signal being shown, the R signal is taken from collector 34 of transistor 32, and applied across a load resistor 33. The voltage drop developed across resistor 33 is applied to the R conductor of the cable. Likewise, the G and B signals are developed across respective load resistors 33 of separate amplifiers 10, and the developed G and B signals applied to the G and B conductors, respectively. As stated above, the center, G conductor may be inverted by an inverter 133.

For providing precompensating signal shaping to the signal provided to conductor 124, a series of resistive-capacitive networks as illustrated by networks 119 of FIG. 7 may be added across resistor 120. These networks provide signal shaping of the video signal to counteract distortion effected by conductor 124, this shaping including increased energy in the rising and falling edges of the video signals. In general, for longer conductors, overall capacitance of networks 119 is increased and resistance is decreased, while for shorter conductors, overall capacitance is decreased and resistance is increased. In receiver 130 (FIG. 7), RC network 161 across resistor 160 and capacitor 159 provides shaping for received video signals, this shaping serving to restore frequency responses of the video signals which are lost by attenuation of the video signals by conductors 124. One embodiment of this invention is illustrated in FIG. 6. Further, it is to be noted that an embodiment of the invention may be illustrated further by the following:

(a) three sources (transmitter) of analog signals, these being shown by transmitters 84, 86, and 88 of FIG. 6. Discrete ones of the transmitters may be illustrated by transmitter 100 in FIG. 7. FIG. 7b also illustrates a facet of the transmitters wherein the output of one of the transmitters is inverted.

(b) There is also a receiver for each transmitter as shown by receivers 94, 96, and 98 in FIG. 6;

(c) a cable connects each transmitter and receiver as illustrated in FIG. 6, and conductor positioning of color conductors is illustrated by the example shown in FIG. 8 in certain instances; and (d) one of the color signals is inverted by the system, there being inverters at both the transmitter and receiver as shown in FIG. 6.

Figure 10:
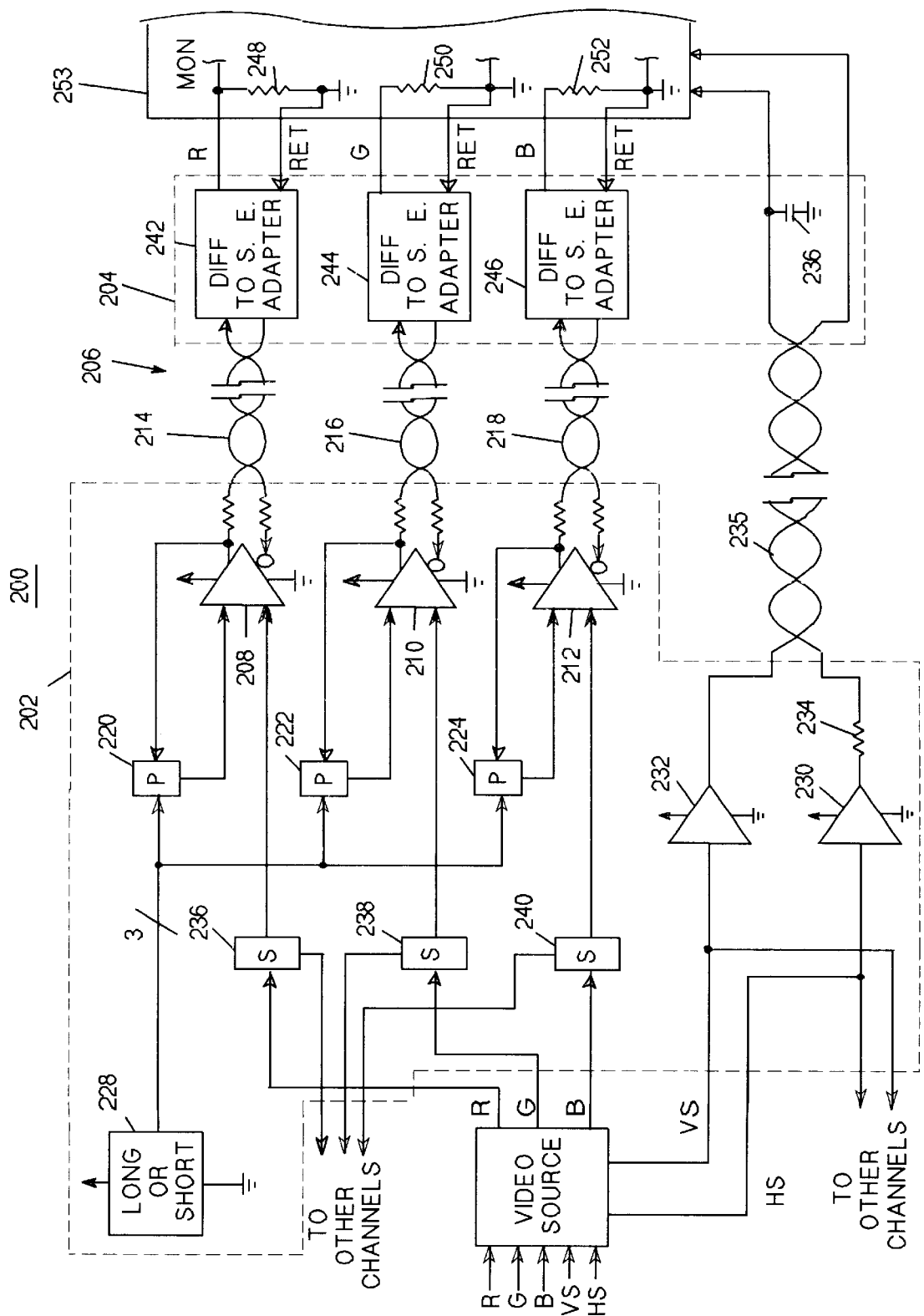
FIG. 10 is a block diagram wherein a long video link such as that shown in FIG. 6 is connected to a shorter video link of the instant invention for distributing video signals to a plurality of locations.

In the instance where it is necessary to route an analog color video signal from a video source at a central location a relatively long distance on the order of 1000–2000 feet and then distribute the video signal to a plurality of monitors, such as in airport terminals where information relating to incoming/outgoing flights is sent over the longer link and then distributed to monitors at each gate, reference is made to FIG. 10. Here, the termination point or receiver for the video links, instead of a monitor such as monitor 92 in FIG. 6, is illustrated by a box labeled VIDEO SOURCE in FIG. 10, box being coupled to a shorter video link illustrated as a block diagram. In this block diagram, circuit 200 is shown having a transmitter portion 202 and a receiver portion 204 coupled by inexpensive unshielded cable 206, which may be category 5 cable commonly used to connect telephones in office buildings and homes. Particularly, such a cable having four sets of twisted pair conductors 214, 216, 218, and 235 is used in this application to carry VGA signals R, G, and B, their respective return signals, and horizontal sync and vertical sync signals HS and VS. Additionally, telephone-type connectors of the modular type may be used to couple the twisted pair conductors to transmitter 202.

Transmitter portion 202 is constructed having differential amplifiers 208, 210, and 212, each having two inputs, one of which inputs receiving a respective one of the R, G, and B video signals. The second input of each of differential amplifiers 208, 210, and 212 receives high frequency portions of a respective video signal via high pass filters 208a, 210a and 212a along with a feedback-based conditioning signal, these inputs functioning to increase gain of amplifiers 208, 210, and 212 directly with frequency. Thus, amplitude of higher frequency portions of the video signals are increased, countering attenuation of the extended length of twisted pairs 214, 216, and 218. The outputs of amplifiers 208, 210 and 212 are provided as differential outputs of opposite polarity to respective conductors of twisted pairs 214, 216, and 218. As such, one conductor of each of twisted pairs 214, 216, and 218 carries one video signal of a positive polarity, and the other conductor carries substantially the same video signal inverted to an opposite polarity. Current flows of the positive and negative video signals in each of twisted pairs 214, 216, and 218 are in opposite directions as indicated by arrows, and radiate EMI fields which cancel each other, resulting in little or no net EMI radiation of the video signals from the cable. This eliminates the need for EMI shielding in the cable, allowing use of inexpensive unshielded twisted pair cable to carry video signals.

Typically, four sets, or channels, of transmitters 200 are constructed on one printed circuit board so as to distribute four discrete sets of R, G, and B video signals, the original video signals being split by active signal splitting networks 236, 238, and 240. The circuit boards are also configured so that multiple circuit boards each having four channels may be coupled together in "daisy chained" relation, meaning that a single video signal from the video source may be split and differentially retransmitted as many times as necessary over discrete unshielded cables each having 4 pairs of twisted pair conductors.

Preconditioning of the positive R, G, and B video signals is performed in conjunction with feedback by preconditioning networks 220, 222, and 224 prior to applying the differential video signals to respective conductors of twisted pairs 214, 216, and 218 of cable 206. As stated, this preconditioning injects additional energy as a function of frequency into the rising and falling transitions of the video signals to compensate for signal attenuation effected by conductors of the twisted pairs. Additionally, Networks 220, 222, and 224, in combination with switching network 228, provide signal conditioning that optimizes the positive polarity video signals to a particular length of cable. As such, a selection between at least near or far signal transmission may be made simply by setting a switch. In the example shown in FIGS. 10 and 11, the transmitter is optimized for selection of a shorter cable of up to 50 feet, and a longer cable up to 150 feet, meaning that monitors coupled to the circuitry of FIGS. 10 and 11 may be separated by distances up to 300 feet. Of course, the circuitry may be tuned for other lengths of cable, as will be further explained.

The horizontal sync and vertical sync signals from the video source are applied to buffer amplifiers 230 and 232, respectively, with amplifier 230 providing the HS signal via impedance matching resistor 234 to one conductor of twisted pair 235 and amplifier 232 providing the VS signal to the other conductor of twisted pair 235. At the receiver end of the conductor carrying the VS signal, a capacitor 236 is coupled between the conductor carrying the VS signal and signal ground, and functions to attenuate high frequency components of the VS signal, preventing such high frequency components from being inductively coupled to the HS signal conductor. Significantly, the signal ground return for the VS and HS sync signals is provided back through the video transmission conductors 214, 216, and 218 and through low impedance output circuitry of the differential amplifiers to a power supply powering the transmitter. This type of return path is commonly known as a "ground loop", and is normally undesirable. However, Applicants advantageously use such a return path in this instance to eliminate the need for a discrete ground conductor or shield in the cable connecting transmitter 202 and the monitor, as will be further explained.

At the opposite end of twisted pairs 214, 216, and 218, the differential video signals from each of the twisted pairs are applied to a respective one of differential to single ended adapters 242, 244, and 246. These adapters convert the R, G, and B differential video signals to single ended R, G, and B video signals, after which the single ended video signals are applied to respective R, G, and B load resistors 248, 250, and 252 in monitor 253. These load resistors develop the R, G, and B video signals between the video inputs and signal ground, after which the video signals are provided to circuitry of the monitor. The video signal return lines for the R, G, and B signals provide current flow for the negative side of the differential signals back to amplifiers 208, 210, and 212. Terminals in the monitor plug for the identification bits (not shown) are permanently strapped to logic potentials to indicate the particular type signal applied to the monitor. Alternately, instead of applying the single ended video signals to a monitor, the single ended video signals may be applied to other devices adapted for receiving computer video signals.

Figure 11:
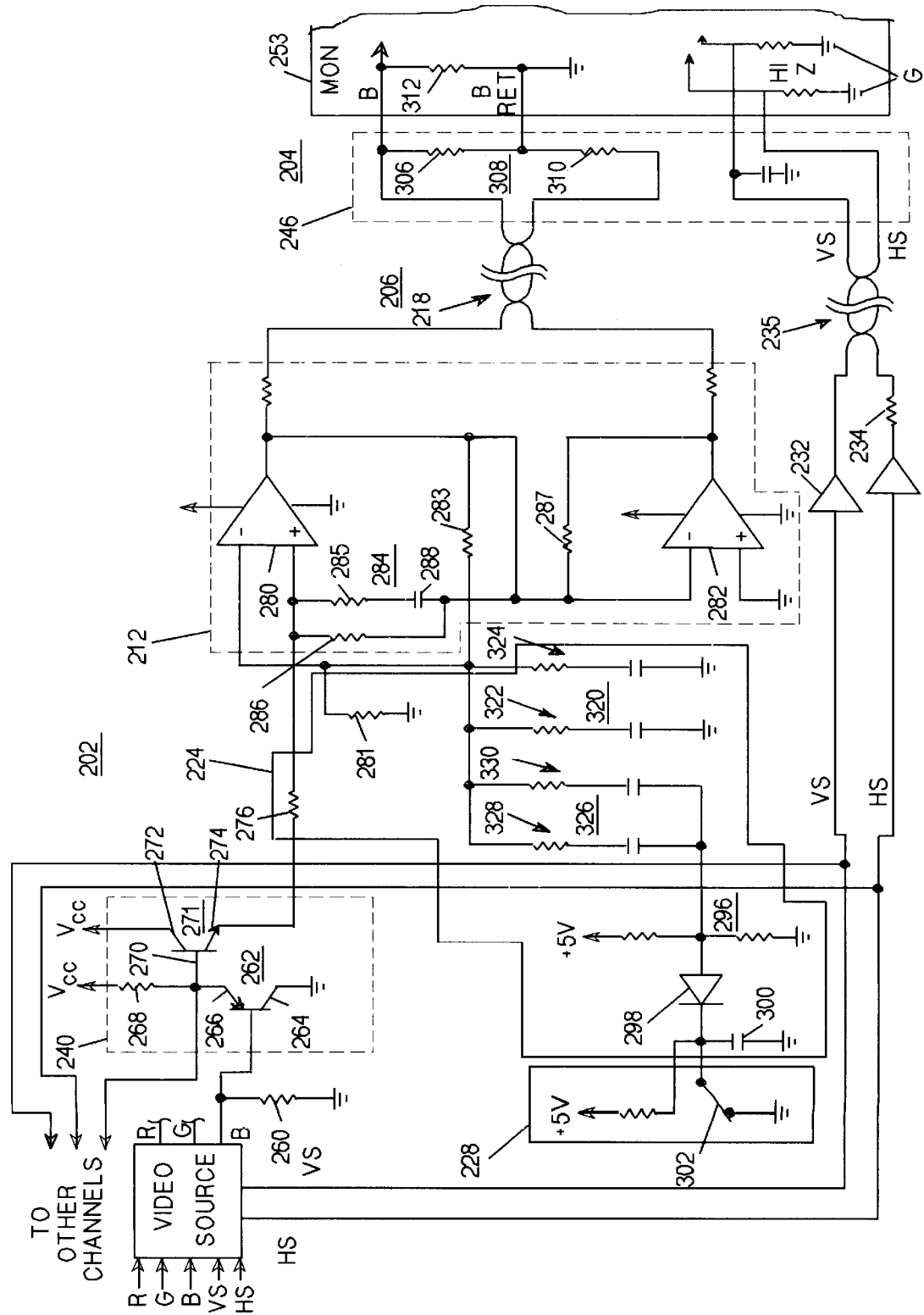
FIG. 11 is a schematic embodiment of a circuit for one of the video transmitter/receivers of FIG. 10.

Referring to FIG. 11, a detailed schematic of one possible embodiment of the system of FIG. 10 is shown. Here, only circuitry related to the B video differential amplifier 212 is illustrated in detail, the circuitry for the R and G amplifiers and adapters being identical to that shown for the B amplifier. Initially, bias power for the transmitter is provided by a power supply conventionally coupled to 115 VAC power. For the B video transmitter, operational amplifiers 280 and 282 provide positive and negative differential outputs, respectively, which differential outputs being applied to respective conductors of twisted pair 218. These amplifiers each have a low impedance output, and are available as integrated circuits such as part number LM6182 available from National Semiconductor.

Initially, the B video signal from the video source, which as stated may be a termination point of a longer VGA video link, is applied across 75 ohm impedance matching resistor 260, and then to signal splitting circuitry 240. In circuitry 240, the signal is first applied to the base of a PNP transistor 262 coupled in emitter follower configuration, with collector 264 coupled to signal ground potential and emitter 266 coupled via resistor 268 to a bias potential from the power source, such as +5 volts, biasing transistor 262 in its operating range. Thus, with a zero volt video signal applied to the base of transistor 262, transistor 262 is biased to a conductive state, with about a 700 millivolt potential being felt on emitter 266 due to the base-emitter drop of transistor 262. Conversely, when the video signal applied to the base of transistor 262 peaks at about 700 millivolts, the potential at emitter 266 rises to a peak of about 1.4 volts. This 1.4 volt potential on emitter 266 is provided to base 270 of NPN transistor 271, also coupled in emitter follower configuration, which reduces a DC level of the video signal by 700 millivolts, offsetting the base-emitter drop across transistor 262. The video signal on emitter 266 is also provided for distribution to other channels, the input of these other channels having a corresponding NPN emitter follower transistor in order to eliminate the base-emitter drop across the corresponding emitter as described for transistor 271.

The collector 272 of transistor 271 is coupled to bias potential, with emitter 274 coupled via attenuation resistor 276 to the non-inverting input of operational amplifier 280. Connected as described, a video signal developed at emitter 266 results in the same signal being developed at emitter 274 of transistor 271 offset by the base-emitter voltage of 700 millivolts, after which the signal is applied to attenuation resistor 276.

Resistor 276, in conjunction with components 282, 285, 286, 287, and 288 attenuate the B video signal by a factor of about three to a peak signal of about 230 millivolts prior to applying the signal to the non inverting input of amplifier 280. A feedback resistor 283 is coupled between the output of amplifier 280 and the inverting input thereof, with the values of feedback resistor 283 and attenuation resistor 281 selected to set the DC gain of amplifier 280 to about +6.5. This gain factor of about +6.5 stabilizes the output of amplifier 280, eliminating ringing that otherwise may occur. The inverting input of amplifier 280 is coupled to precompensation network 224 and to the signal ground reference potential via resistor 281, as will be further explained. The B video signal is also coupled to the inverting input of operational amplifier 282 via RC network 284 and resistor 286, with the non-inverting input of amplifier 282 coupled to the signal ground reference potential. Feedback resistor 287 coupled between the output and inverting input of amplifier 282 in conjunction with resistor 286 sets the DC gain of amplifier 282 to about −6.5, stabilizing the output of amplifier 282 as described for amplifier 280.

RC network 284, which is made up of resistor 285 and capacitor 288, functions as a high pass filter that begins to pass more of the AC portion of the video signal to the inverting input of amplifier 282 at about 1 Mhz. As a result, and with increasing frequency, the gain of amplifier 282 increases to a maximum gain factor of about −20 at an input frequency of 100 Mhz. However, as this portion of the video signal is used only to counteract EMI radiation from the conductor coupled to amplifier 280, no further tuning of this signal is necessary. As such, the only requirement of the negative differential signal in this application is that the signal from amplifier 282 be approximately equal and opposite in amplitude to the positive signal from amplifier 280 and precisely timed therewith. This is not to say that the negative signal from amplifier 282 cannot be used; with appropriate tuning this negative signal may be inverted and used as a video source.

Precompensation network 224, coupled to selectively attenuate the AC portion of the feedback signal provided to amplifier 280 as a function of frequency, is tuned so that amplifier 280 provides an output accurately compensated for line losses of a given length of twisted pair cable. By way of example, network 224 is shown having two tuning circuits, the first designated 320 and used for distances of up to about 50 feet, and constructed of RC circuits 322 and 324. In this example, the values of the resistor and capacitor in RC circuit 322 are selected such that circuit 322 begins to attenuate the feedback frequencies at about 18 Mhz, with this attenuation progressively increasing up to about 75 Mhz, at which frequency an AC gain of about 20 is provided by amplifier 280. By attenuating these feedback frequencies, more gain is obtained from amplifier 280 in this frequency range, which includes the particularly fast rising and falling edges of the video signals. RC circuit 324 is constructed of components having values that cause the circuit to begin attenuating the feedback signal at about 75 Mhz, with this attenuation extending up to about 150 Mhz. Attenuation of the feedback signal in this range provides high frequency peaking of the video signals. In use, only network 320 is used with a cable length up to about 50 feet.

The other tuning network, designated 326, is disabled when a shorter cable length under about 50 feet is used, and is enabled when a longer cable from about 50 feet to about 150 feet is used. Network 326 is constructed of RC circuits designated 328 and 330, circuit 328 tuned to attenuate low frequencies in the feedback signal from about 0.1 Mhz up to about 10 Mhz, while circuit 330 is tuned to attenuate the feedback signal in a range from about 1 Mhz to about 100 Mhz. As such, network 326 provides additional gain at all frequency ranges of the video signals to compensate for losses in these frequency ranges of the longer twisted pair conductors.

The resistor side of networks 320 and 326 is coupled to feedback resistor 283 and to the inverting input of amplifier 280 so as to control AC gain of amplifier 280. Here, when a shorter cable is used, and with a frequency of the video signal up to about 1 Mhz, little gain of amplifier 280 is experienced beyond that of the set DC gain of about +6.5 as defined by resistors 281 and 283. As frequency of the feedback video signal applied to the inverting input of amplifier 280 increases to about 50 Mhz, which is found in the rising and falling edges of the video signals, the RC circuits of network 320 begin to become active, attenuating the feedback signal and progressively increasing gain of amplifier 280 up to a factor of about 13 to compensate for line losses at these higher frequencies. Where longer cable lengths are used, attenuation of the feedback signal begins at a lower frequency, about 0.1 Mhz, so as to provide additional energy at these lower frequencies, boosting overall signal strength. While the embodiment disclosed herein transmits high quality VGA video up to about 150 feet, additional RC circuits in network 326 may be used to tune the output of amplifier 280 for longer lengths of cable. Likewise, fewer RC circuits or less attenuation of the feedback signal may be used to tune the output of amplifier 280 to shorter lengths of cable.

For enabling and disabling network 326, a voltage divider 296 provides a positive bias of about 2.5 volts to the capacitor side of RC circuits 328 and 330. A diode 298 is coupled to pass, when forward biased, AC current from the capacitors of circuits 328 and 330 and direct current from divider 296. A capacitor 300 physically located proximate diode 298 provides a low impedance path to ground reference potential at the diode, allowing remote DC control of the biasing of diode 298. A single pole single throw switch 302 is coupled as shown to capacitor 300 and diode 298 to provide signal ground potential to capacitor 300 and diode 298 in the position shown, forward biasing diode 298. This provides an AC current path to the signal ground reference potential via capacitor 300 that enables network 326. Networks 320 and 326 then provide maximum attenuation of the feedback signal and increase AC gain of amplifier 280, causing amplifier 280 to develop a signal appropriate for a longer conductor. When switch 302 is positioned to disconnect the signal ground potential, +5 volts is applied to diode 298, causing it to become reverse biased and disable network 326. In this configuration, only network 320 attenuates the feedback signal in the higher frequencies as described without overall lower frequency gain, generating high frequency peaking of the video signal appropriate for a shorter cable length.

At the opposite end of twisted pair 218, the differential signal, which as described is balanced about the signal ground reference potential of about 0 volts DC, is provided as an input to differential to single ended converter 246. Converter 246 is a passive, resistive converter, meaning that it uses no active components to effect conversion to a single ended signal. Additionally, the resistive components, along with strapping for the identification bits, may be fitted into the plug connecting cable 206 to the monitor, eliminating the need for a separate enclosure for components of receiver 204.

In converter 246, the differential signal is applied across a voltage divider network 308 constructed of a resistor 306, which may be about 151 ohms, and resistor 310 which may be about 51 ohms. Resistor 306 of converter 246 is coupled as shown across the 75 ohm load resistor 312 in the monitor, with a midpoint of divider network 308 coupled to the video return side, or signal ground, of load resistor 312. As such, the positive side of the differential video signal is applied across 75 ohm load resistor 312 in the monitor to develop the video signal. The negative side of the differential video signal is coupled to the video return terminal of the monitor via resistor 310. Thus, the center point (0 VDC) of the differential signal is referenced to the video return in the monitor, thus eliminating the need for a separate ground connection between the transmitter and the receiver and monitor. As stated, this negative side carries signal current flow in an opposite direction to that of the positive video signal current flow, and neutralizes EMI radiation from the conductors carrying the respective positive video signals.

As described above, the HS and VS sync signals are passed through receiver 204 and each applied to a high impedance input, symbolized by application of the sync signals across HI Z resistive loads, after which the sync signals are applied to the VS and HS sync circuitry in the monitor. Additionally, these high impedance inputs are referenced to the signal ground potential in the monitor, as shown by signal ground symbol G. With this construction, the return path for the HS and VS signals occurs back through the six differential video conductors in cable 206, where a return path is provided through the low impedance outputs of differential amplifiers 208, 210, and 212 and the power source. As this is a small current flow distributed between the six video conductors and outputs of the six differential amplifiers, and which occurs during the retrace period of the video signals, this ground current path for the sync signals has no effect on the video signals.

Having thus described our invention and the manner of its use, it is apparent that we have provided an improved three-color processing and transmission system to which incidental changes may be made thereto which fairly fall within the scope of the following appended claims, wherein

We claim:

1. An extended-in-length computer video communications link for transmitting computer video signals comprising:
   a source of computer video signals including red, green, and blue video signals,
   a video transmitter comprising a plurality of amplifiers, one of each said amplifiers for each of said red, green, and blue video signals, each said amplifier comprising:
      a signal input for receiving a one of said red, green and blue video signals,
      frequency sensitive compensating circuitry responsive to a said video signal so that said amplifier provides a first video signal that increases in amplitude with increasing frequency at a first output and a second video signal that is an inverse of said first video signal at a second output,
   a twisted pair of conductors for each said amplifier, with first and second conductors of said twisted pair coupled at one end to respective said first and second outputs of said amplifier,
   an adapter for each of said twisted pair of conductors, each said adapter coupled to an opposite end of a respective one of said twisted pair of conductors, each said adapter receiving said first video signal and said second video signal and providing a respective said video signal as a single ended output, and further configured to provide a ground reference potential for said transmitter at said adapter, whereby need for a reference ground conductor between said transmitter and said adapter is eliminated.

2. A video communications link as set forth in claim 1 wherein said source of computer video signals further comprises horizontal sync signals and vertical sync signals, said horizontal sync signals and said vertical sync signals applied to respective conductors of an additional twisted pair of conductors.

3. A video communications link as set forth in claim 2 wherein a reference potential for said vertical sync signals and said horizontal sync signals is provided through said twisted pairs of conductors carrying said computer video signals and through said first output and said second output of each said amplifier.

4. A video communications link as set forth in claim 1 wherein said transmitter further comprises signal shaping circuitry coupled to each said compensating circuitry for shaping said first computer video signal to compensate for signal losses for a preselected length of each said twisted pair of conductors.

5. A video communications link as set forth in claim 4 wherein said signal shaping circuitry further comprises a first shaping circuit for shaping said video signals for transmission over a relatively short length of said twisted pairs of conductors, and a second shaping circuit for shaping said video signals for transmission over a relatively long length of said twisted pairs of conductors, and a switching circuit for switching between said first shaping circuit and said second shaping circuit so that a user may select signal shaping for either said relatively short length of said twisted pairs of conductors or said relatively long length of said twisted pairs of conductors.

6. A video communications link as set forth in claim 1 wherein said source of video signals comprises a termination point of another video communications link.

7. A video communications link as set forth in claim 1 wherein said transmitter further comprising signal splitting circuitry for distributing said video signals to a plurality of locations.

8. An extended-in-length video communications system for transmitting computer analog video signals comprising:
   a source of computer analog video signals including at least one analog video signal and discrete horizontal sync and vertical sync signals,
   a video transmitter coupled to said source of computer analog video signals, said video transmitter comprising at least one signal amplifier having a signal input, and a first signal output and a second signal output, said analog video signal coupled to said signal input,
   a first twisted pair of conductors, with a first conductor of said twisted pair of conductors coupled at one end to said first signal output and a second conductor of said twisted pair of conductors coupled at one end to said second signal output, said first and second conductors being approximately equal in length,
   signal line compensating circuitry coupled to said amplifier for developing an optimized analog video signal optimized for a particular length of said first conductor, said optimized analog video signal applied to said first conductor from said first signal output,
   opposing video signal circuitry coupled to said amplifier for developing an opposing video signal opposite in polarity and approximately equal in amplitude to said optimized analog video signal, said opposing video signal applied to said second conductor from said second output, causing current flow in said second conductor approximately equal to and in an opposite direction to current flow in said first conductor, greatly reducing electromagnetic radiation from said twisted pair of conductors,
   a passive adapter coupled to an opposite end of said first conductor and said second conductor for developing a single ended computer analog video signal from said optimized analog video signal, and wherein said optimized analog video signal and said opposing video signal are balanced about a signal around potential at said adapter, said adapter further configured to provide a around reference potential for said transmitter at said adapter, eliminating need for a around reference conductor between said transmitter and said adapter.

9. A video communications link as set forth in claim 2 wherein opposite ends of said first and second conductors are coupled to a monitor so that said second conductor serves as a video return for said optimized video signal, said video transmitter further comprising:
   a first amplifier and a second amplifier each having an input and an output, with said horizontal sync signal coupled to a said input of said first amplifier and said vertical sync signal coupled to a said input of said second amplifier,
   a second twisted pair of conductors having third and fourth conductors, with one end of said third conductor coupled to said output of said first amplifier and one end of said fourth conductor coupled to said output of said second amplifier, with an opposite end of said third conductor and said fourth conductor coupled to said monitor,
   whereby a return path for said horizontal sync signal and said vertical sync signal is developed through said first conductor and said second conductor and said first signal output and said second signal output of said signal amplifier without a discrete ground conductor between said transmitter and said monitor.

10. A video communications link as set forth in claim 9 further comprising a capacitor coupled between said fourth conductor and a signal ground potential, for attenuating high frequency components of said vertical sync signal, preventing said high frequency components from being inductively coupled to said third conductor.

11. A video communications link as set forth in claim 8 wherein said source of computer video signals is developed from a long distance video communications link.

12. A video communications link as set forth in claim 8 wherein said signal amplifier comprises a first amplifier and a second amplifier each having a low impedance output, said first and second amplifiers configured as a differential amplifier, with said first amplifier providing said optimized video signal and said second amplifier providing said opposing video signal.

13. A video communications link as set forth in claim 12 wherein said signal line compensating circuitry further comprises at least one feedback attenuating circuit coupled to said first amplifier for attenuating feedback to said first amplifier as a function of frequency of said first signal output and a particular length of said first conductor, whereby gain of said first amplifier increases with increasing frequency of said video signal so that said gain closely offsets attenuation by said particular length of said first conductor.

14. A video communications link as set forth in claim 13 further comprising a plurality of feedback attenuating circuits selectively connectable to said first amplifier for closely offsetting attenuation of said first signal output by a discrete particular length of a plurality of particular lengths of said first conductor.

15. A video communications link as set forth in claim 14 wherein said signal line compensating circuitry is coupled to said second amplifier and causes said second amplifier to develop a like increase of gain as said first amplifier, so that said opposing video signal greatly reduces said electromagnetic radiation from said plurality of said particular lengths of said first conductor.

16. A computer video signal communications system for selectively coupling sets of R, G, B computer color video signals from one of a plurality of computers to a separately located color monitor, said system comprising:
   a transmitter including:
      switching means for selectively providing a said set of said color video signals from a selected said computer, and
      a first signal format converter responsive to each said color signal of a said set of color signals from said switching means for converting a signal format of each said color signal from single ended format to a balanced format;
   a plurality of sets of twisted pair conductors, each set of said conductors having a first end and second end, with a said first end of each of said sets of conductors receiving a discrete color video signal from said transmitter;
   a receiver coupled to said second ends of said sets of said twisted pair conductors and including:

a plurality of second signal format converters for converting a said balanced format of each said discrete color video signal from each said set of conductors from balanced to unbalanced format; and signal means responsive to unbalanced format signals from said receiver for coupling color video signals to a color video monitor.

17. A system as set forth in claim 16 wherein said receiver includes frequency compensation means for boosting a frequency response of at least one said color video signal directly as a function of frequency.

18. A computer video signal communications system for selectively coupling a set of R, G, and B computer color video signals from one of a plurality of computers to a separately located color monitor, said system comprising:

a transmitter including:
switching means for selectively providing said set of R, G, and B computer color video signals from a selected said computer, and a first signal format converter responsive to each said R, G and B color video signal for converting a signal format of each said R, G and B color video signal from single ended format to a balanced format;

a set of twisted pair conductors for each said balanced format R, G, and B color video signals, each said set of twisted pair conductors having a first end and a second end, with a said first end of each of said sets of twisted pair conductors receiving a discrete one of said balanced format R, G, and B color video signals from said transmitter;

a receiver coupled to said second ends of said sets of twisted pair conductors and including:
frequency compensation means for boosting a frequency response of each said R, G and B color video signal directly as a function of frequency;

a plurality of second signal format converters for converting said balanced format of each said R, G and B color video signal from each said set of twisted pair conductors from balanced to unbalanced format; and signal means responsive to siad unbalanced format signals from said receiver for coupling said R, G and B color video signals to a color video monitor.

19. A computer color video signal communications system for selectively coupling sets of R, G, and B computer color video signals from one of a plurality of computers to a separately located color monitor, said system comprising:

a transmitter including:
switching means for selectively providing a set of said sets of R, G and B computer color video signals from a selected said computer, and a first signal format converter responsive to each said R, G and B computer color video signal of a said set of R, G, and B computer color video signals for converting a signal format of each said R, G and B computer color video signal from single ended format to a balanced format;

a plurality of sets of twisted pair conductors, each set of twisted pair conductors having a first end and a second end, with a said first end of each said set of twisted pair conductors receiving a discrete one of said balanced format R, G and B computer color video signals of a said set from said transmitter;

a receiver coupled to each said second end of each of said sets of said twisted pair conductors and including:

frequency compensation means for boosting a frequency response of each of said R, G and B computer color video signals directly as a function of frequency;

a plurality of second signal format converters for converting said balanced format of each said R, G and B computer color video signal from each said set of conductors from said balanced format to said unbalanced format;

signal means responsive to unbalanced format signals from said receiver for coupling said R, G, and B computer color video signals to a color video monitor, and, a set of unbalanced twisted pair conductors coupled between said transmitter and said receiver, with one conductor of said conductors of said set of unbalanced twisted pair conductors carrying a horizontal synchronization signal and the other conductor of said unbalanced set of twisted pair conductors carrying a vertical synchronization signal, said horizontal synchronization signal and said vertical synchronization signal being with respect to a common reference within said receiver, said common reference being connected to at least one said second signal format converter, providing a return path through said twisted pair of conductors from said receiver to said transmitter.

20. A computer color video signal communications system as set forth in claim 19 wherein each said second signal format converter further comprises a center tapped impedance including a center tap connected across a said second end of said conductors of a respective said set of twisted pair conductors whereby said reference is connected from said receiver to said transmitter.

* * * * *

UNITED STATES PATENT AND TRADEMARK OFFICE
CERTIFICATE OF CORRECTION

PATENT NO. : 6,184,919 B1
DATED : February 6, 2001
INVENTOR(S) : Asprey et al.

Page 1 of 1

It is certified that error appears in the above-identified patent and that said Letters Patent is hereby corrected as shown below:

<u>Column 1</u>,
Lines 49, 51 and 52, change "around" to -- ground --

Signed and Sealed this

First Day of January, 2002

Attest:

JAMES E. ROGAN
*Attesting Officer*     *Director of the United States Patent and Trademark Office*